United States Patent
Do

(10) Patent No.: US 8,854,904 B2
(45) Date of Patent: Oct. 7, 2014

(54) SEMICONDUCTOR MEMORY DEVICE

(75) Inventor: Chang-Ho Do, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 202 days.

(21) Appl. No.: 13/445,155

(22) Filed: Apr. 12, 2012

(65) Prior Publication Data

US 2013/0163352 A1    Jun. 27, 2013

(30) Foreign Application Priority Data

Dec. 21, 2011    (KR) .................... 10-2011-0139419

(51) Int. Cl.
*G11C 7/10*    (2006.01)
(52) U.S. Cl.
USPC ............... 365/189.17; 365/189.07; 365/225.7
(58) Field of Classification Search
CPC .... G11C 7/10; G11C 29/4401; G11C 29/785; G11C 29/787; G11C 29/802
USPC .............................. 365/189.17, 189.07, 225.7
See application file for complete search history.

(56) References Cited

U.S. PATENT DOCUMENTS

| | | | | |
|---|---|---|---|---|
| 5,657,291 A * | 8/1997 | Podlesny et al. | .......... | 365/230.05 |
| 6,285,620 B1 * | 9/2001 | Ho et al. | .................... | 365/225.7 |
| 6,646,947 B2 * | 11/2003 | Fukui et al. | ............. | 365/189.17 |
| 7,317,645 B2 * | 1/2008 | Kim et al. | ..................... | 365/200 |
| 7,596,049 B2 * | 9/2009 | Jeong et al. | .............. | 365/230.03 |

FOREIGN PATENT DOCUMENTS

KR    1997-0051427    7/1997

* cited by examiner

*Primary Examiner* — Pho M Luu
(74) *Attorney, Agent, or Firm* — IP & T Group LLP

(57) ABSTRACT

A semiconductor memory device includes a plurality of repair fuse units configured to program repair target addresses respectively for repair target memory cells, wherein at least one of the repair fuse units is programmed with data information used for different purposes from the repair target addresses, a plurality of address comparison units each configured to compare an access target address with a corresponding address of the repair target addresses and determine whether to perform a repair operation or not, and a data transfer unit configured to transfer the data information to a corresponding circuit of the semiconductor memory device.

16 Claims, 2 Drawing Sheets

SEMICONDUCTOR MEMORY DEVICE

CROSS-REFERENCE TO RELATED APPLICATIONS

The present application claims priority of Korean Patent Application No. 10-2011-0139419, filed on Dec. 21, 2011, which is incorporated herein by reference in its entirety.

BACKGROUND

1. Field

Exemplary embodiments of the present invention relate to a semiconductor designing technology, and more particularly, to a semiconductor memory device including a repair fuse circuit.

2. Description of the Related Art

Generally, a semiconductor memory device including a Double Data Rate Synchronous Dynamic Random Access Memory (DDR SDRAM) includes a large number of memory cells. As the integration degree of the semiconductor memory device increases by the advancement of fixing technology, it has greater number of memory cells. If there is even one defective memory cell among the numerous number of memory cells mounted on a semiconductor memory device, the semiconductor memory device may not perform an intended operation and may be abandoned. As semiconductor memory device fabrication technology develops, few number of memory cells may be defective. Nevertheless, abandoning the whole semiconductor memory device due to such memory cells may decrease production yield. Therefore, a semiconductor memory device is typically provided with a redundancy memory cell along with normal memory cells.

A redundancy memory cell may be a memory cell provided for the purpose of replacing a defective memory cell of normal memory cells. Specifically, when a defective memory cell occurs among the normal memory cells and it is accessed, the redundancy memory cell which operates as a normal memory cell is accessed instead of the defective memory cell. Although an address corresponding to a defective memory cell is inputted in a semiconductor memory device, the semiconductor memory device may secure a desired operation by using the redundancy memory cell and making the redundancy memory cell accessed. Hereinafter, the defective memory cell, which is a memory cell with a defect, is referred to as a 'repair target memory cell.'

Meanwhile, the semiconductor memory device includes other circuits, such as a repair fuse circuit, together with the redundancy memory cell to perform a repair operation. The repair fuse circuit stores an address corresponding to a repair target memory cell, which is, hereinafter, referred to as a 'repair target address.' Each of the fuses in the repair fuse circuit is programmed with the repair target address. The semiconductor memory device performs a repair operation based on the programmed repair target address.

For example, programming a fuse means a series of operations for storing an address data in a fuse. Generally, a method for programming includes a laser cutting method and an electrical cutting method. The laser cutting method is a method of cutting a line with a laser beam by blowing a fuse based on an address data, and the electrical cutting method is a method of cutting a line by applying an overcurrent to a fuse and melting the fuse based on an address data. The laser cutting method is relatively simple, compared with an electrical cutting method. However, the laser cutting method may be typically performed in the stage of wafer, which is a stage before the semiconductor memory device is fabricated as a package.

FIG. 1 is a block diagram illustrating a redundancy circuit of a conventional semiconductor memory device.

Referring to FIG. 1, the redundancy circuit includes a plurality of repair fuse units 110, a plurality of address comparison units 120, and an enable fuse unit 130.

Each of the repair fuse units 110 is programmed with a repair target address corresponding to a repair target memory cell. Each of the address comparison units 120 compares an address ADD<0:N>, where N is a natural number, with a corresponding fuse address FU_ADD<0:N>, among a plurality of fuse addresses that are respectively outputted from the repair fuse units 110, and generates a repair decision signal HIT_SUM<0:M>. The fuse addresses FU_ADD<0:N> are respectively programmed in the repair fuse units 110, and the fuse addresses FU_ADD<0:N> correspond to repair target addresses, respectively. Subsequently, the enable fuse unit 130 generates an enable signal FU_EN<0:M>, where M is a natural number, depending on whether the repair fuse units 110 are programmed or not. Whether to enable the enable signal FU_EN<0:M> is decided depending on whether the repair fuse units 110 are programmed or not.

Each of the repair fuse units 110 includes a plurality of fuse circuits. FIG. 1 shows a semiconductor memory device where an address is formed of N+1 bits and M+1 addresses are programmed. In short, the repair fuse units 110 include (N+1)×(M+1) fuse circuits.

Meanwhile, the semiconductor memory device includes fuse circuits for diverse purposes other than such repair fuse circuits. The fuse circuits for diverse purposes include a tuning fuse circuit which is used for tuning a voltage in a static voltage generation circuit that operates sensitively responding to an environment, a test fuse circuit that is used for testing, and a control fuse circuit for controlling diverse mode selections. The fuse circuits may be designed in the semiconductor memory device separately from the repair fuse circuit.

The number of memory cells mounted on a semiconductor memory device is increasing so that the number of repair fuse circuits and the number of fuse circuits for storing data may be increased. In the trend that the size of semiconductor memory devices becomes small, such an increase in the number of repair fuse circuit and in the number of other fuse circuits may be obstacle to prevent the size of the semiconductor memory devices from being reduced.

SUMMARY

An embodiment of the present invention is directed to a semiconductor memory device which is capable of programming not only a repair target address but also data information used for different purposes from the repair target addresses in a repair fuse circuit.

In accordance with an exemplary embodiment of the present invention, a semiconductor memory device includes a plurality of repair fuse units configured to program repair target addresses respectively for repair target memory cells, wherein at least one of the repair fuse units is programmed with data information used for different purposes from the repair target addresses, a plurality of address comparison units each configured to compare an access target address with a corresponding address of the repair target addresses and determine whether to perform a repair operation, and a data transfer unit configured to transfer the data information to a corresponding circuit of the semiconductor memory device.

The semiconductor memory device may further include an enable signal generation unit configured to generate an enable signal depending on whether the repair fuse unit is programmed with the repair target address or the data information.

In accordance with another exemplary embodiment of the present invention, a semiconductor memory device includes a common fuse unit configured to store a plurality of data used for different purposes, and a data transfer unit configured to transfer the data to corresponding circuits of the semiconductor memory device.

The data may be different types from each other.

The data may be used for different operation durations from each other.

The semiconductor memory device in accordance with an exemplary embodiment of the present invention may not further include a fuse circuit for programming data information used for different purposes from a repair target address by programming the repair target address and the data information in a repair fuse circuit.

DETAILED DESCRIPTION

Figure 1:
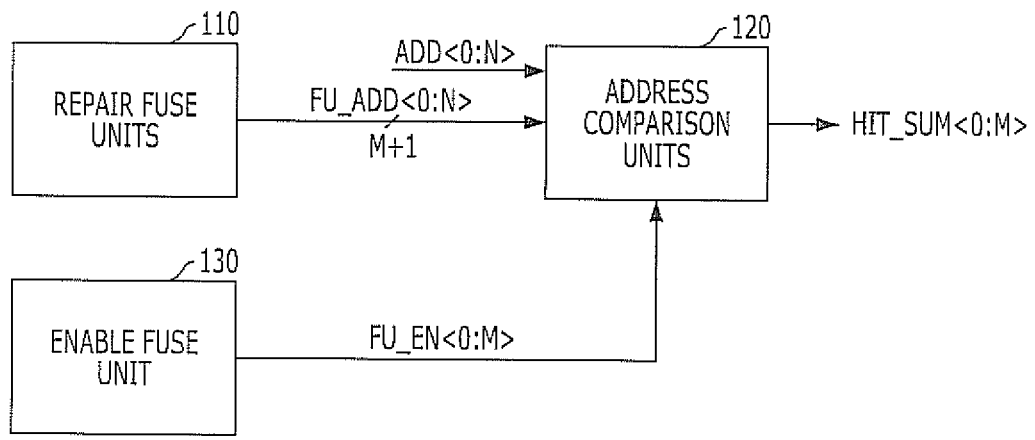
FIG. 1 is a block diagram illustrating a redundancy circuit of a conventional semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
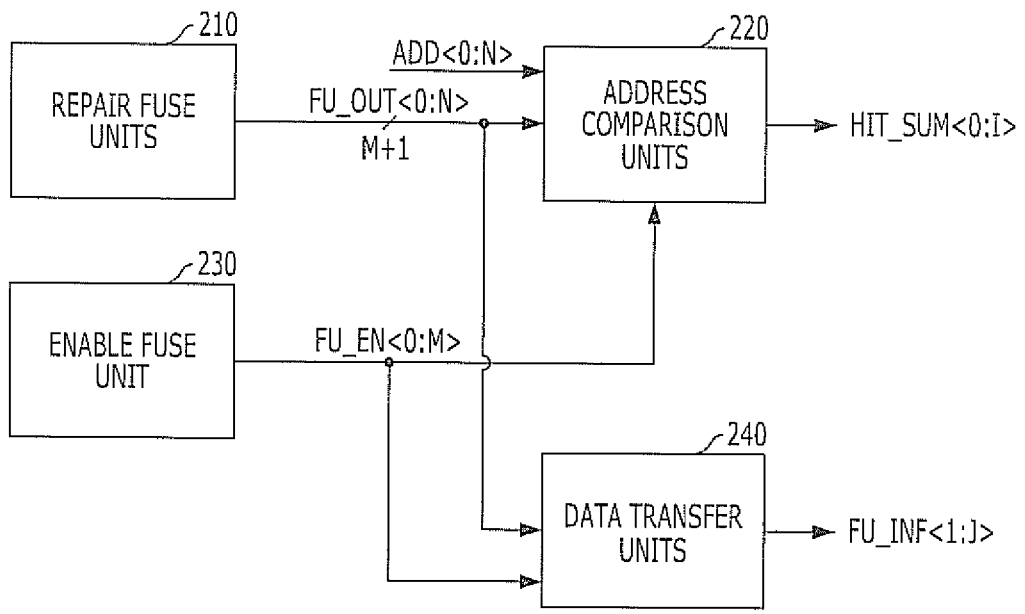
FIG. 2 is a block diagram illustrating a semiconductor memory device in accordance with an exemplary embodiment of the present invention.

FIG. 2 is a block diagram illustrating a semiconductor memory device in accordance with an exemplary embodiment of the present invention.

Referring to FIG. 2, the semiconductor memory device in accordance with the exemplary embodiment of the present invention includes a plurality of repair fuse units 210, a plurality of address comparison units 220, an enable fuse unit 230, and a plurality of data transfer units 240.

The repair fuse units 210 store a plurality of data, and the repair fuse units 210 are programmed not only with repair target addresses that respectively correspond to repair target memory cells but also data information used for different purposes from the repair target addresses. In short, some of the repair fuse units 210 are programmed with the repair target addresses, and the others are programmed with the data information. Generally, data used for different purposes may have different operation durations and different types from each other. In this embodiment of the present invention, however, the data information may have the substantially same operation duration or type as that of the repair target addresses.

Each of the address comparison units 220 compares an address ADD<0:N> that is inputted from the outside with a corresponding fuse output signal FU_OUT<0:N>, among a plurality of fuse output signals that are outputted from the repair fuse units 210, in response to an enable signal FU_EN<0:M>, and generates a repair decision signal HIT_SUM<0:I> for deciding whether to perform a repair operation or not based on the comparison result, where I is a natural number. The fuse output signals FU_OUT<0:N> include signals corresponding to repair target addresses, and also include signals corresponding to data information used for different purposes from the repair target addresses.

Subsequently, the enable fuse unit 230 includes a plurality of fuse circuits, and the enable fuse unit 230 generates the enable signal FU_EN<0:M>based on the kind of data programmed in the repair fuse units 210. In other words, the enable signal FU_EN<0:M> has a logic level value that is decided depending on whether the repair target addresses or the data information are programmed in the repair fuse units 210.

Lastly, the data transfer units 240 receive the fuse output signals FU_OUT<0:N> and output data information FU_INF<1:J> in response to the enable signal FU_EN<0:M>, where J is a natural number. The generated data information FU_INF<1:J> is transferred to a circuit that is in need of the data information FU_INF<1:J>.

Hereinafter, the circuit operation of the semiconductor memory device in accordance with the embodiment of the present invention is described briefly. For the description purpose, it is described as an example that M=I+J. The relationship between the M, I, and J may be designed differently depending on the intended operation.

First, each of the repair fuse units 210 includes a plurality of fuse circuits. FIG. 2 shows a structure that an address is formed of N+1 bits and M+1 addresses are programmed. That is, the semiconductor memory device may include M+1 repair fuse units each having N+1 fuse circuits. Therefore, when the number of the repair target addresses to be programmed is smaller than M+1, the remaining repair fuse units are programmed with data information used for different purposes from the repair target addresses.

Each fuse of the enable fuse unit 230 is programmed depending on the kind of corresponding data programmed in the repair fuse units 210. For example, when the repair fuse unit 210 is programmed with the repair target address, the enable signal FU_EN<0:M> may be activated by programming a corresponding fuse so that the fuse output signal FU_OUT<0:N> corresponding to the repair target address is inputted to the address comparison unit 220 to output the repair decision signal HIT_SUM<0:I>. When data information that is not a repair target address is programmed in the repair fuse unit 210, the enable signal FU_EN<0:M> may be deactivated by programming a corresponding fuse so that the fuse output signal FU_OUT<0:N> corresponding to the data information is transferred to the data transfer unit 240 and transferred to a corresponding circuit.

The semiconductor memory device in accordance with the embodiment of the present invention programs data information other than the repair target addresses in the repair fuse units 210. Therefore, it may not further include a fuse circuit for programming data information, which is used in a conventional semiconductor memory device.

Figure 3:
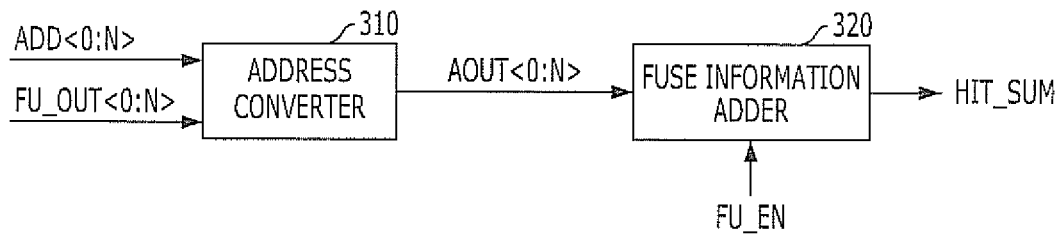
FIG. 3 is a block diagram illustrating a plurality of address comparison units shown in FIG. 2.

FIG. 3 is a block diagram illustrating a plurality of address comparison units 220 shown in FIG. 2. For the illustrative purpose, one address comparison unit 220 among the multiple address comparison units 220 is described representatively.

Referring to FIG. 3, the address comparison unit 220 includes an address converter 310 and a fuse information adder 320.

The address converter 310 receives an address ADD<0:N> and a fuse output signal FU_OUT<0:N>, converts the address ADD<0:N> based on the fuse output signal FU_OUT<0:N>, and outputs an output signal AOUT<0:N>. The fuse information adder 320 adds the output signal AOUT<0:N> and a fuse enable signal FU_EN and outputs the adding result as a repair decision signal HIT_SUM.

Figure 4:
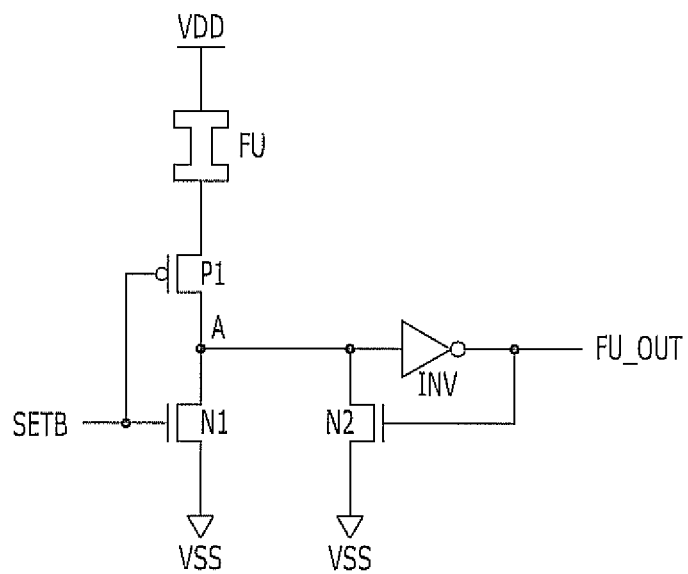
FIG. 4 is a circuit diagram illustrating a plurality of repair fuse units shown in FIG. 2.

FIG. 4 is a circuit diagram illustrating a plurality of repair fuse units 210 shown in FIG. 2.

Referring to FIG. 4, the fuse circuit includes a first NMOS transistor N1 coupled with an A node for receiving a set signal SETB through a gate; a PMOS transistor P1 coupled between the A node and a fuse FU for receiving the set signal SETB through a gate; and an inverter INV and a second NMOS transistor N2 for latching the logic level value of the A node and outputting the latch result.

Hereinafter, the circuit operation of the fuse circuit will be described.

First, when the set signal SETB is in a logic high level, the A node is initialized with a ground voltage VSS, and the initialized value is sustained by the inverter INV and the second NMOS transistor N2. Subsequently, when the set signal SETB transitions to a logic low level, the logic level value of the A node is decided depending on the programming state of the fuse FU, that is, whether the fuse FU is cut or not. When the fuse FU is not cut, the logic level value of the A node is a logic high level of a power supply voltage VDD. When the fuse FU is cut, the logic level value of the A node is sustained at a logic low level of the ground voltage VSS. Therefore, the logic level value of the fuse output signal FU_OUT is decided based on whether the fuse FU is cut or not.

The fuse circuit described above may operate the same for a case that the repair target addresses are programmed and a case that data information other than the repair target addresses is programmed. The fuse circuits included in the enable fuse unit 230 may also perform the same circuit operation.

As described above, the semiconductor memory device may remove a fuse circuit for programming data information used for different purposes from repair target addresses because the semiconductor memory device uses the multiple repair fuse units 210 not only for programming the repair target addresses but also for programming the data information.

According to an exemplary embodiment of the present invention, a semiconductor memory device is designed to include a repair fuse circuit for storing repair target addresses without an additional fuse circuit for programming data information used for different purposes from the repair target addresses. Therefore, the area of the semiconductor memory device is decreased.

While the present invention has been described with respect to the specific embodiments, it will be apparent to those skilled in the art that various changes and modifications may be made without departing from the spirit and scope of the invention as defined in the following claims.

The logic gates and transistors are exemplarily described in the embodiment described above, and the positions and types of the logic gates and transistors may be realized differently depending on the polarity of an input signal.

What is claimed is:

1. A semiconductor memory device, comprising:
    a plurality of repair fuse units configured to program repair target addresses respectively for repair target memory cells, wherein at least one of the repair fuse units is programmed with data information used for different purposes from the repair target addresses;
    a plurality of address comparison units each configured to compare an access target address with a corresponding address of the repair target addresses and determine whether to perform a repair operation or not; and
    a data transfer unit configured to transfer the data information to a corresponding circuit of the semiconductor memory device.

2. The semiconductor memory device of claim 1, further comprising:
    an enable signal generation unit configured to generate an enable signal depending on whether the repair fuse unit is programmed with the repair target address or the data information.

3. The semiconductor memory device of claim 2, wherein a logic level value of the enable signal is determined depending on whether the repair fuse unit is programmed with the repair target address or the data information.

4. The semiconductor memory device of claim 2, wherein the address comparison units and the data transfer unit operate in response to the enable signal.

5. The semiconductor memory device of claim 1, wherein the repair fuse units include more fuses than the number of the repair target addresses.

6. The semiconductor memory device of claim 2, wherein the enable signal generation unit includes a plurality of fuses programmed depending on depending on whether the repair fuse unit is programmed with the repair target address or the data information.

7. The semiconductor memory device of claim 1, wherein the repair target addresses and the data information are used for different operation durations.

8. A semiconductor memory device, comprising:
    a fuse unit configured to store a plurality of data including repair target addresses and data information used for different purposes from each other; and
    a data transfer unit configured to transfer the data information to corresponding circuits of the semiconductor memory device, the data information is from the fuse unit
    an address comparison unit configured to compare the repair target addresses from the fuse unit with an input address and transfer the repair target addresses.

9. The semiconductor memory device of claim 8, wherein the repair target addresses and data information are different types from each other.

10. The semiconductor memory device of claim 8, wherein the repair target addresses and data information are used for different operation durations from each other.

11. The semiconductor memory device of claim 8, further comprising:
    a control unit configured to control the data transfer unit in response to the data information stored in the fuse unit.

12. The semiconductor memory device of claim 8, wherein the repair target addresses include address information.

13. The semiconductor memory device of claim 12, further comprising:
    an address comparison unit configured to compare the data with an input address to determine whether to replace a memory cell of the input address with a redundancy memory cell.

14. The semiconductor memory device of claim 8, wherein the data information include test control information.

15. The semiconductor memory device of claim 8, wherein the data information include tuning control information.

16. The semiconductor memory device of claim 8, wherein the data information include mode selection control information.

\* \* \* \* \*